(12) United States Patent
Lee et al.

(10) Patent No.: US 10,172,254 B2
(45) Date of Patent: Jan. 1, 2019

(54) HANDLE LOCKING DEVICE AND ELECTRONIC SYSTEM HAVING THE SAME

(71) Applicant: Wistron Corporation, New Taipei (TW)

(72) Inventors: Tung-Ping Lee, New Taipei (TW); Huang-Yeh Lin, New Taipei (TW)

(73) Assignee: Wiwynn Corporation, New Taipei (TW)

( * ) Notice: Subject to any disclaimer, the term of this patent is extended or adjusted under 35 U.S.C. 154(b) by 122 days.

(21) Appl. No.: 15/401,103

(22) Filed: Jan. 9, 2017

(65) Prior Publication Data

US 2018/0116068 A1    Apr. 26, 2018

(30) Foreign Application Priority Data

Oct. 24, 2016  (TW) .............................. 105134215 A

(51) Int. Cl.
*H05K 7/14*    (2006.01)
*E05B 65/46*   (2017.01)
*H05K 5/02*    (2006.01)

(52) U.S. Cl.
CPC ........... *H05K 7/1489* (2013.01); *E05B 65/46* (2013.01); *H05K 5/0204* (2013.01)

(58) Field of Classification Search
CPC ....... G06F 1/187; G06F 1/183; H05K 7/1487; H05K 5/0221; H05K 7/1409; H05K 7/1489

See application file for complete search history.

(56) References Cited

U.S. PATENT DOCUMENTS

| 5,325,263 | A | * | 6/1994 | Singer ..................... G06F 1/184 361/679.39 |
| 5,721,669 | A | * | 2/1998 | Becker ................. G11B 33/124 361/679.31 |
| 6,008,984 | A | * | 12/1999 | Cunningham ....... G11B 33/128 312/332.1 |

(Continued)

FOREIGN PATENT DOCUMENTS

TW    201325395 A1    6/2013

OTHER PUBLICATIONS

Office action dated Apr. 25, 2017 for Taiwan application No. 105134215, filing date Oct. 24, 2016, p. 1 line 11-14, p. 2-3 and p. 4 line 1-20.

*Primary Examiner* — Bradley Duckworth
(74) *Attorney, Agent, or Firm* — Winston Hsu

(57) ABSTRACT

A handle locking device and an electronic system of the invention use the rotation of a handle for push movement against a case so as to move an activation bracket to have displacement relative to a swinging bracket. Pushed by the activation bracket, the swinging bracket produces a lateral swing at one end accordingly so that a hook at the end of the swinging bracket laterally moves between a locking position and an unlocking position. Further rotation of the handle will further push against the shelf where the electronic system is mounted and bring the electronic system to move relative to the shelf and eject. A single rotational stroke of the handle is transformed into consecutive unlocking movement and ejection movement. Insertion, locking, unlocking, and ejection of the electronic system on the shelf are easily done by manual operation of the handle without the need of additional tools.

18 Claims, 15 Drawing Sheets

(56) References Cited

U.S. PATENT DOCUMENTS

| | | | | |
|---|---|---|---|---|
| 6,158,105 | A * | 12/2000 | Suh | E05B 73/0082 |
| | | | | 29/453 |
| 6,381,146 | B1 * | 4/2002 | Sevier | H05K 7/1409 |
| | | | | 200/51 R |
| 6,648,149 | B2 * | 11/2003 | Robertson | G11B 33/127 |
| | | | | 211/26 |
| 6,929,338 | B2 * | 8/2005 | Chang | G06F 1/181 |
| | | | | 312/223.2 |
| 7,283,371 | B1 * | 10/2007 | Grouell | G06F 1/185 |
| | | | | 361/741 |
| 7,843,698 | B2 * | 11/2010 | Takizawa | G06F 1/181 |
| | | | | 361/732 |
| 8,899,702 | B2 * | 12/2014 | Mao | H05K 7/1487 |
| | | | | 312/222 |
| 9,207,721 | B2 * | 12/2015 | Conn | G06F 1/181 |
| 9,268,357 | B2 * | 2/2016 | Kyle | G06F 1/16 |
| 9,380,718 | B2 * | 6/2016 | Wang | H05K 5/0221 |
| 9,753,504 | B2 * | 9/2017 | Norton | G06F 1/183 |
| 2011/0157779 | A1 * | 6/2011 | Chang | H05K 5/0221 |
| | | | | 361/679.01 |
| 2013/0279129 | A1 * | 10/2013 | Xie | G06F 1/16 |
| | | | | 361/752 |

\* cited by examiner

HANDLE LOCKING DEVICE AND ELECTRONIC SYSTEM HAVING THE SAME

BACKGROUND OF THE INVENTION

1. Field of the Invention

The invention relates to a locking device, and more particularly, to a handle locking device for a removable electronic system.

2. Description of the Prior Art

As a service model for internet design, blade servers or rack servers come with unified exterior standard in cooperation with shelves for maximum expandability and least occupation of space in specific place. When these electronic systems that are designed to have only limited possible dimensions following the requirement of international standard are to be installed in a large, stand-up, standardized shelf, the case of each server should be slid into the slides of the shelf to a certain position in order to be connected to a number of connectors at the back of the shelf. Additional means are also needed for effectively locking the case of the server on the shelf.

As a general solution in the prior art, fixtures like screws are commonly used as locking means of the servers. However, unlocking or locking the servers using conventional method always take times and are not as much as an easy way when it comes to replacing the servers or maintenance. Furthermore, it also takes much greater effort to eject the server from the shelf, which needs to overcome the resistance of the connectors.

SUMMARY OF THE INVENTION

Embodiments of the disclosure provide a handle locking device and an electronic system having the same to offer users instinctive and easy operation of locking and unlocking of a server in order to solve the inconvenient mounting/dismounting issue of servers in the prior art.

According to an embodiment of the disclosure, an electronic system with handle locking device is provided. The electronic system is mounted to a shelf in a removable way and includes a case and a handle locking device. The case has a first side wall and a second side wall adjoining to each other. The handle locking device is disposed at a location where the first side wall and the second side wall adjoin. The handle locking device includes a swinging bracket, an activation bracket, and a handle. A first end of the swinging bracket is fixed to the case and a second end of the swinging bracket includes a hook. The activation bracket is disposed at the case and is movable along a first direction with respect to the case to push the swinging bracket to swing with respect to the case along the first end as a first axle. The hook is selectively configurable to be at a locking position or at an unlocking position moving along a second direction with respect to the case when the swinging bracket swings with respect to the case. The handle is pivoted to the activation bracket via a second axle and is rotatable along the second axle with respect to the activation bracket from a first position to a second position. When the handle is positioned at the first position, the hook is configured to be at the locking position with respect to the case; when the handle rotates from the first position to the second position, the handle pushes the case to move the activation bracket along the first direction with respect to the case, the activation bracket pushing the swinging bracket accordingly, in which the hook is configured to be at the unlocking position with respect to the case.

According to another embodiment of the disclosure, a handle locking device is provided. The handle locking device is used for a case of an electronic system and includes a swinging bracket, an activation bracket, and a handle. A first end of the swinging bracket is fixed to the case and a second end of the swinging bracket includes a hook. The activation bracket is disposed at the case and is movable along a first direction with respect to the case to push the swinging bracket to swing with respect to the case along the first end as a first axle. The hook is selectively configurable to be at a locking position or at an unlocking position moving along a second direction with respect to the case when the swinging bracket swings with respect to the case. The handle is pivoted to the activation bracket via a second axle and is rotatable along the second axle with respect to the activation bracket from a first position to a second position. When the handle is positioned at the first position, the hook is configured to be at the locking position with respect to the case; when the handle rotates from the first position to the second position, the handle pushes the case to move the activation bracket along the first direction with respect to the case, the activation bracket pushing the swinging bracket accordingly, in which the hook is configured to be at the unlocking position with respect to the case.

For the embodiments of the disclosure, the handle locking device further includes an elastic restoring component connected to the first end of the swinging bracket and the activation bracket. The elastic restoring component is stretched to store an elastic restoring force when the activation bracket moves along the first direction with respect to the case.

For the embodiments of the disclosure, the elastic restoring component is a stretching spring.

For the embodiments of the disclosure, the first side wall of the case includes a first slot, the second side wall of the case includes a second slot, the activation bracket is moveable with respect to the case within the case, passing through the first slot and extending outward the case, and the hook passes through the second slot and is configurable to be at the locking position or at the unlocking position with respect to the case.

For the embodiments of the disclosure, the activation bracket is located between the swinging bracket and the second side wall of the case.

For the embodiments of the disclosure, the swinging bracket includes an opening and the activation bracket includes a slant-faced protrusion correspondingly extending through the opening. A slant face of the slant-faced protrusion in the opening pushes against the swinging bracket and the hook moves accordingly from the locking position to the unlocking position along the second direction when the activation bracket moves along the first direction with respect to the case.

For the embodiments of the disclosure, the activation bracket includes two slides and the swinging bracket includes two tracks having orientation along the first direction and corresponding to the position of the two slides. The two slides extend through the two tracks respectively such that the activation bracket moves with respect to the swinging bracket along the first direction.

For the embodiments of the disclosure, the handle includes a first abutting portion, a second abutting portion, and a handle portion. The first abutting portion and the handle portion are located at opposite sides of the second axle. The first abutting portion abuts against the case to move the activation bracket along the first direction with respect to the case when the handle is configured to be at the second position.

For the embodiments of the disclosure, the second abutting portion is located adjacent to the first abutting portion and the handle is rotatable along the second axle with respect to the activation bracket further from the second position to a third position. The second abutting portion abuts against the shelf to move the case and the handle locking device along the first direction with respect to the shelf when the handle is configured to be at the third position.

For the embodiments of the disclosure, the first abutting portion and the second abutting portion are chamfered.

For the embodiments of the disclosure, when the hook is configured to be at the locking position, the hook abuts against the shelf for restraining movement of the case along the first direction with respect to the shelf.

The handle locking device and the electronic system having such handle locking device provided by the embodiments of the disclosure use the rotation of the handle for push movement against the case so as to move the linked activation bracket to have displacement relative to the swinging bracket and to move the hook to have lateral movement. One single rotational stroke of the handle can be transformed into consecutive unlocking movement and ejection movement. Insertion, locking, unlocking, and ejection of the electronic system on the shelf are easily done by manual operation of the handle without the need of additional tools.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. In the following discussion and in the claims, the terms "include" and "comprise" are used in an open-ended fashion. Also, the term "couple" is intended to mean either an indirect or direction electrical/mechanical connection. Thus, if a first device is coupled to a second device, that connection may be through a direct electrical/mechanical connection, or through an indirect electrical/mechanical connection via other devices and connections.

Figure 1:
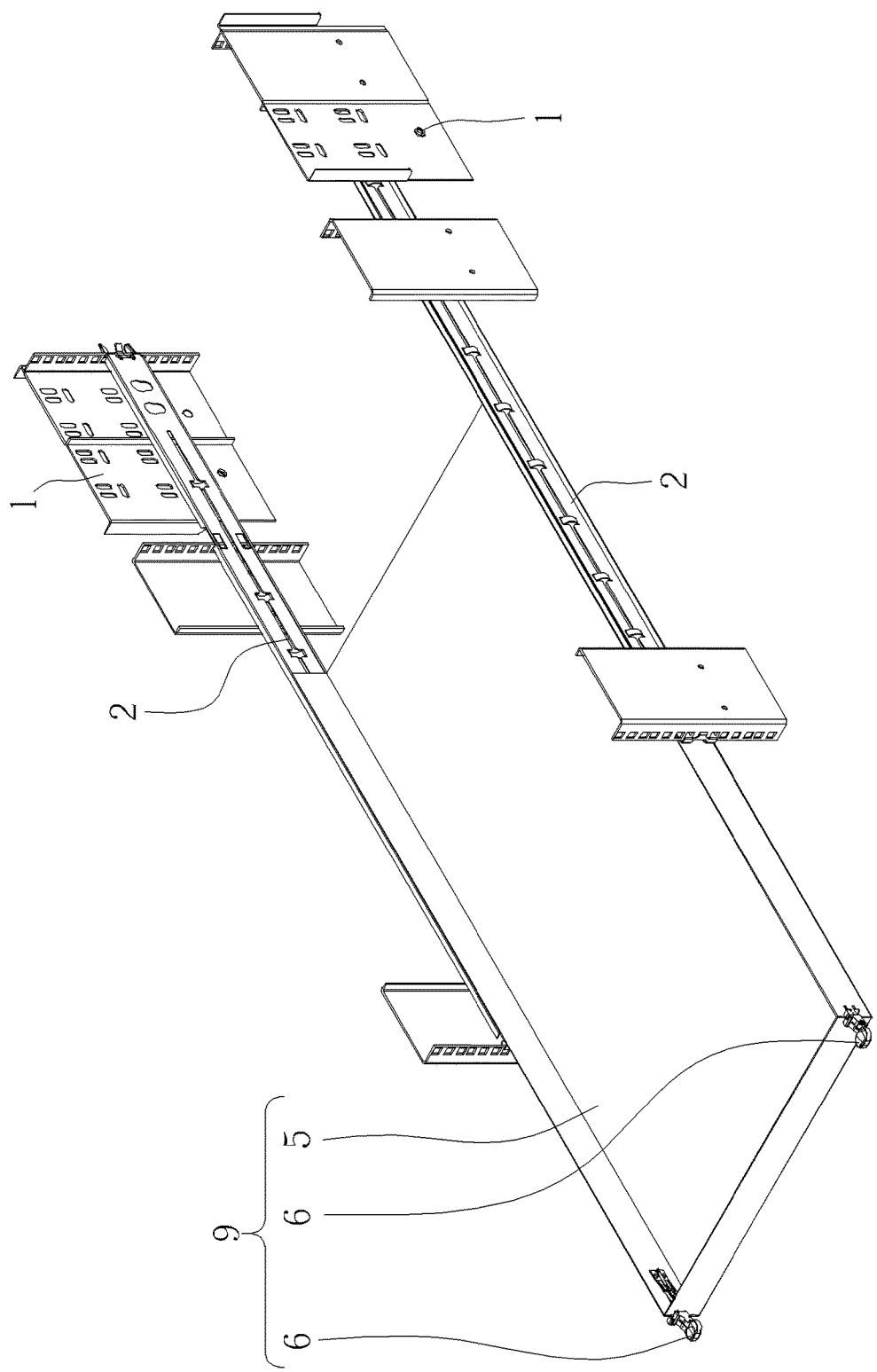
FIG. 1 is a schematic diagram showing an electronic system placed on a shelf and yet to be slid to a fixed position according to an embodiment of the disclosure.
Figure 2:
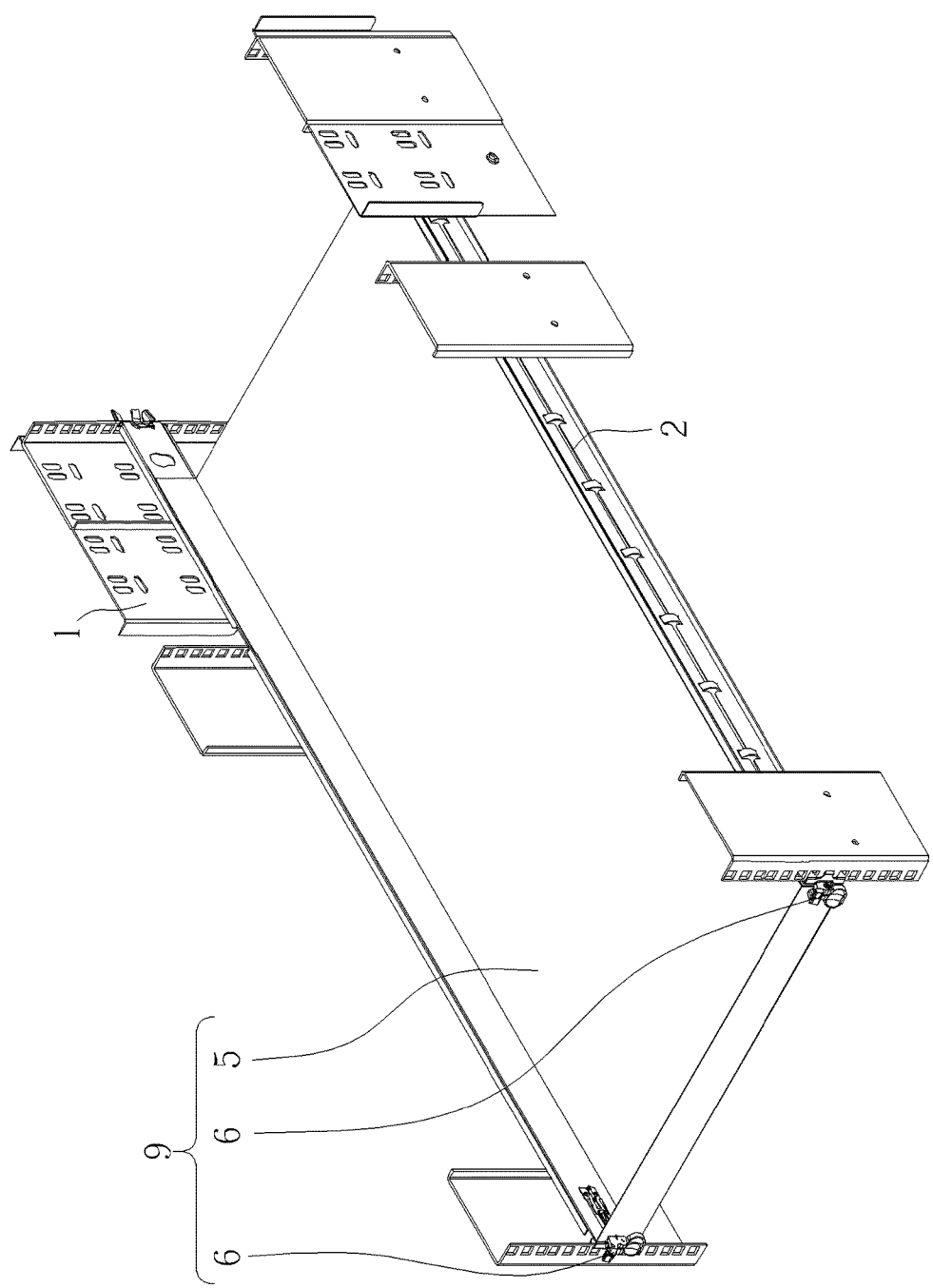
FIG. 2 is a schematic diagram showing the electronic system slid to the fixed position on the shelf.

Please refer to FIG. 1 and FIG. 2. FIG. 1 is a schematic diagram showing an electronic system placed on a shelf and yet to be slid to a fixed position according to an embodiment of the disclosure and FIG. 2 is a schematic diagram showing the electronic system slid to the fixed position on the shelf. An electronic system 9 is preferably a blade server or a rack server, which includes a case 5 and handle locking devices 6 at the left and right sides of the case 5. Any necessary component for the electronic system 9 within the case 5 should be well understood by any person skilled in the art and is not illustrated for clarity purpose. The electronic system 9 is mounted to a shelf 1 in a sliding, removable way. More specifically, two guides are disposed at both sides of the shelf 1, whereas the case 5 of the electronic system 9 can slide at the guides 2 so as to slide into the shelf 1 and mounted to the shelf 1. FIG. 1 shows that the electronic system 9 has yet been sliding into the shelf 1 completely and in FIG. 2, the electronic system 9 is completely slid into the shelf 1 and fixed therein via the handle locking devices 6 at both the right side and the left side.

Figure 3:
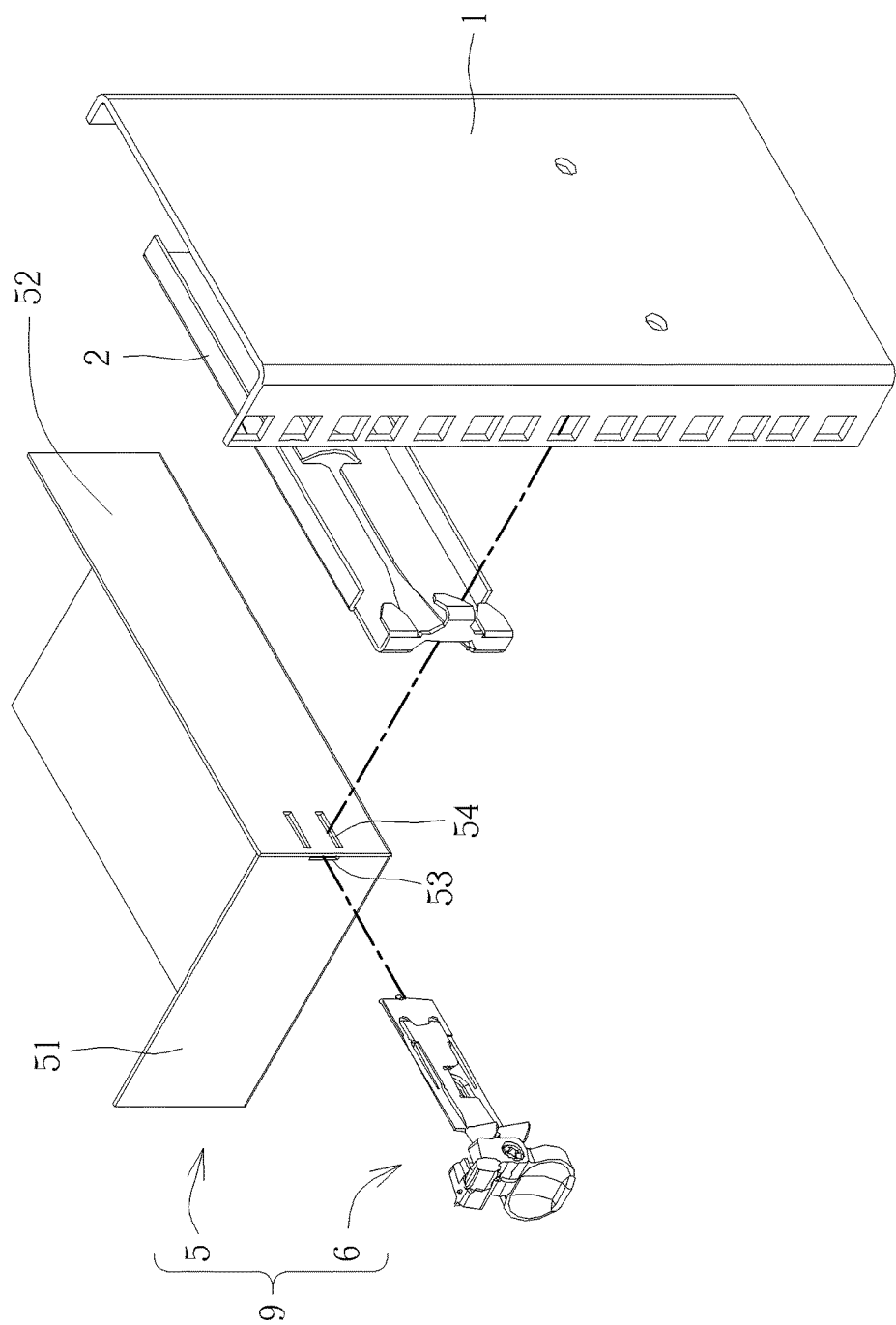
FIG. 3 is a schematic diagram showing a partial exploded view of the electronic system and the shelf according to the disclosure.

Please refer to FIG. 3. FIG. 3 is a schematic diagram showing a partial exploded view of the electronic system and the shelf according to the disclosure. For what are illustrated in FIG. 3 and every follow-up illustrations and description, the right part of the case 5 of the electronic system 9 along with the handle locking device 6 at the right and the right part of the shelf 1 are shown and described. As for the relevant components, structures of components at the left part are mapped related to the right part components. It should be noted that the description about the components at the right part also applies to the components at the left part.

In FIG. 3, the case 5 has a first side wall 51 and a second side wall 52 adjoining to each other. The first side wall 51 includes a first slot 53 and the second side wall 52 includes second slots 54. The handle locking device 6 is disposed at a location where the first side wall 51 and the second side wall 52 adjoin and a guiding component, not shown in the figure, can further be disposed at the second side wall 52 of the case 5 for cooperation with the guide 2 to allow the case 5 for sliding into the shelf 1 via the guide 2.

Figure 4:
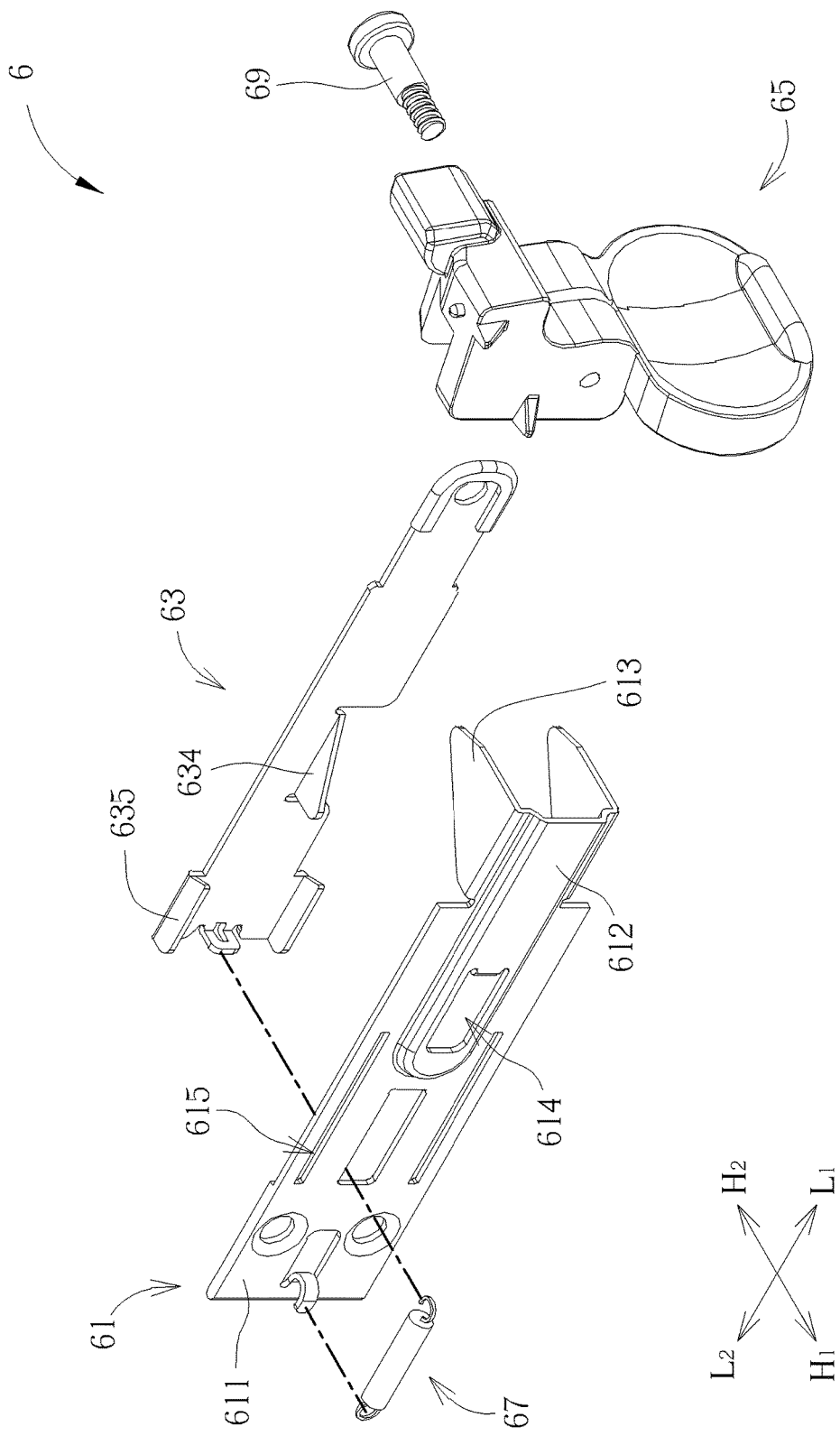
FIG. 4 is a schematic diagram showing an exploded view of each component of the handle locking device.

Please refer to FIG. 4. FIG. 4 is a schematic diagram showing an exploded view of each component of the handle locking device. In one embodiment, the handle locking device 6 includes a swinging bracket 61, an activation bracket 63, a handle 65, and an elastic restoring component 67. The swinging bracket 61 has a first end 611 and a second end 612. The first end 611 of the swinging bracket 61 is fixed to the case 5 and more specifically, to the inner side of the second side wall 52 of the case 5. The second end 612 of the swinging bracket 61 is unfixed and has a hook 613 extending toward direction H2. It can be recognized that the swinging bracket 61 is a component taking the first end 611 as a first axle and capable of producing slight swinging with respect to the case 5. The activation bracket 63 is also disposed at the inner side of the second side wall 52 and more specifically, the activation bracket 63 is located between the swinging bracket 61 and the second side wall 52 of the case 5 and is moveable between the swinging bracket 61 and the second side wall 52 with respect to the case 5. The activation bracket 63 further passes through the first slot 53 of the first side wall 51 (referring to FIG. 3) and extends outward the case 5. The hook 613 further passes through the second slots 54 of the second side wall 52.

Figure 5:
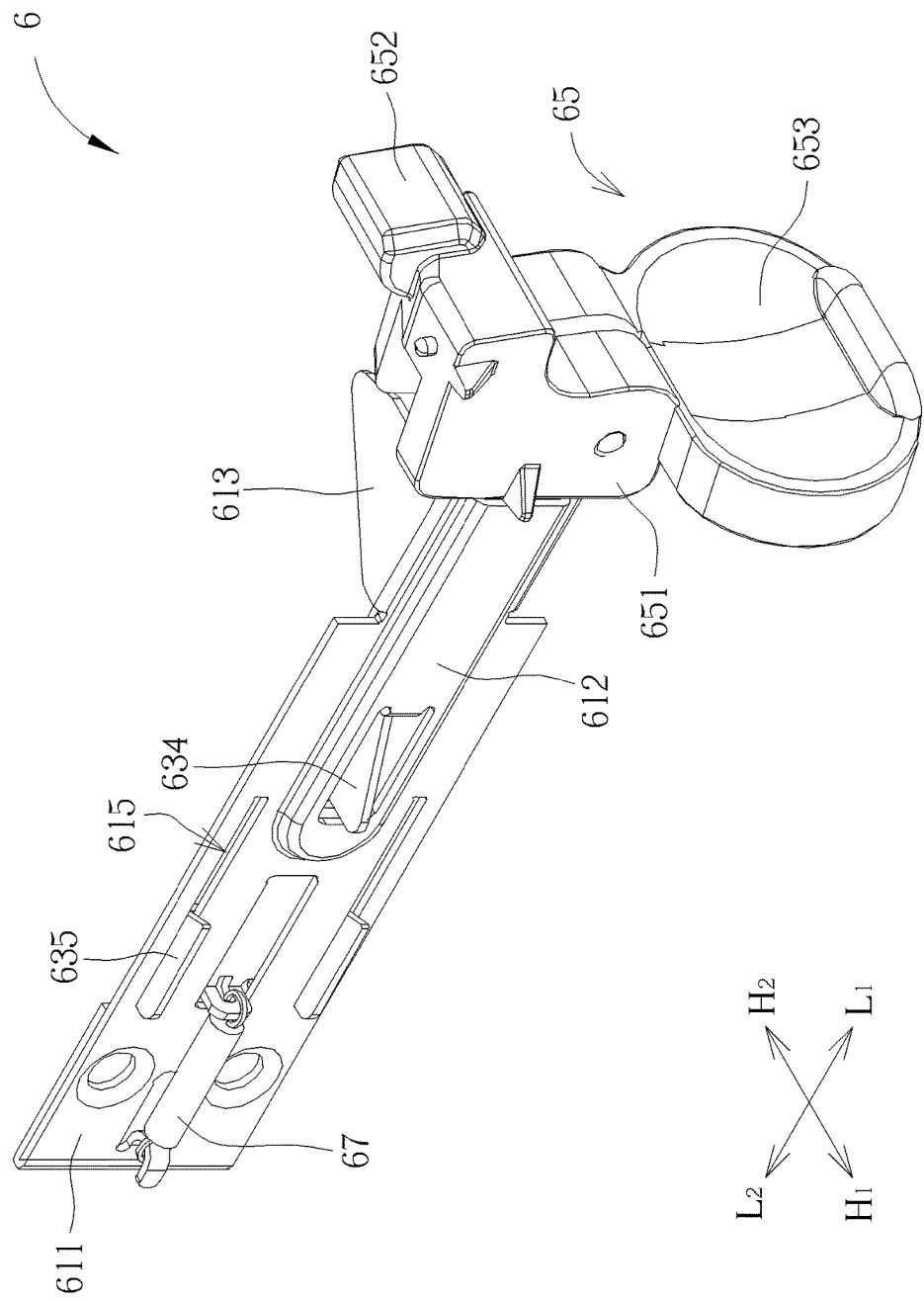
FIG. 5 is a schematic diagram showing the hook of the handle locking device configured to be at a locking position.
Figure 6:
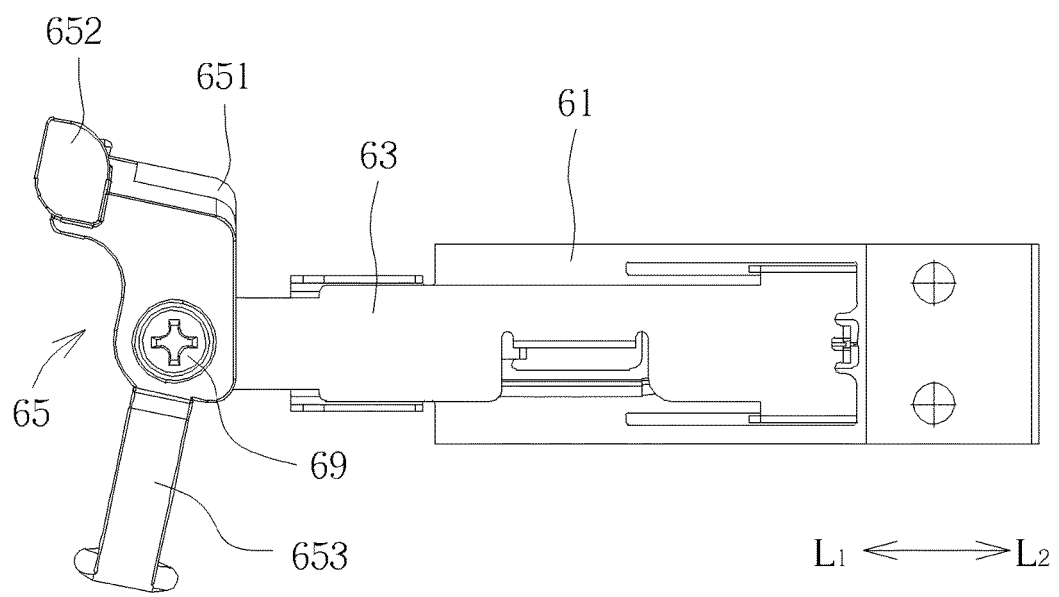
FIG. 6 is a schematic diagram showing a side view of the handle locking device in FIG. 5.
Figure 7:
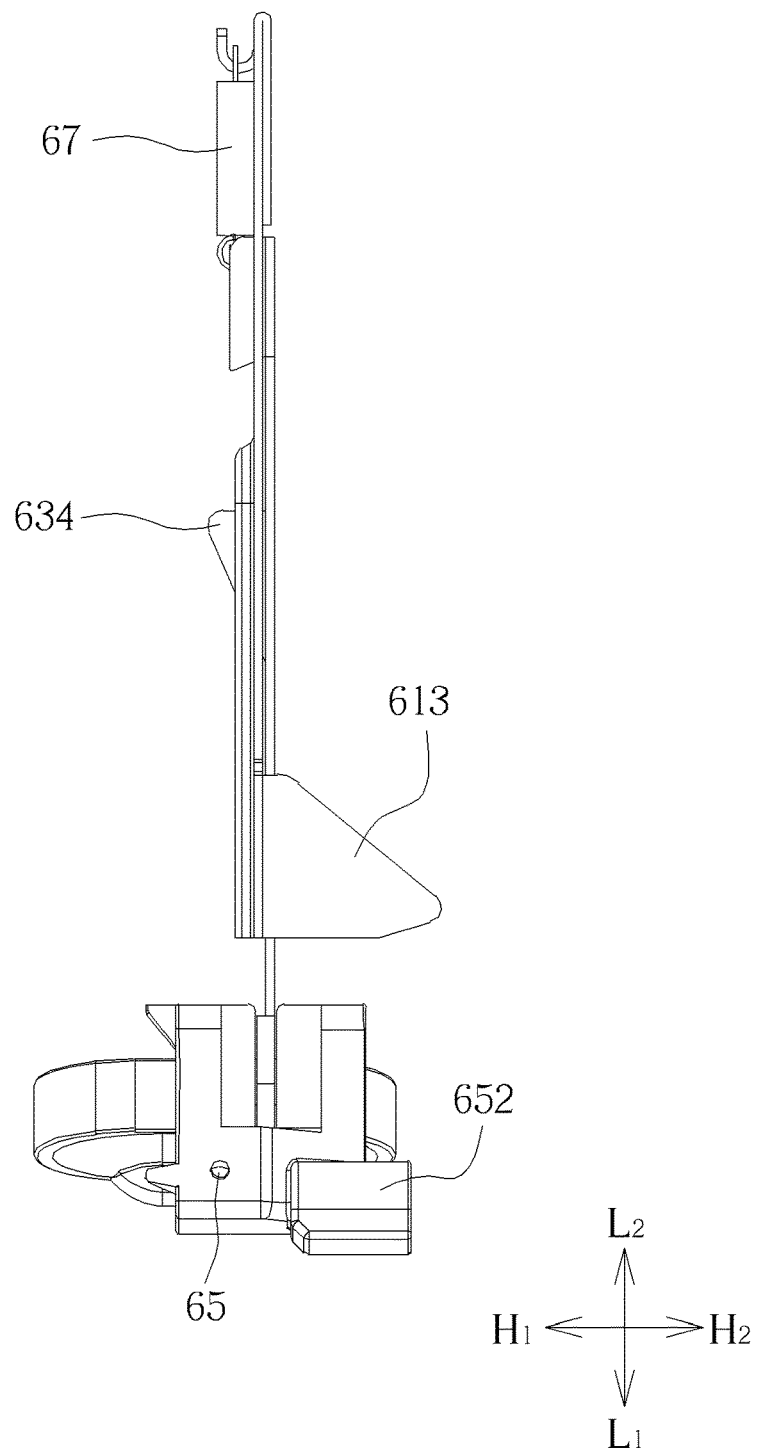
FIG. 7 is a schematic diagram showing a top view of the handle locking device in FIG. 5.

Please refer to FIG. 5 to FIG. 7. FIG. 5 is a schematic diagram showing the hook of the handle locking device configured to be at a locking position, FIG. 6 is a schematic diagram showing a side view of the handle locking device in FIG. 5, and FIG. 7 is a schematic diagram showing a top view of the handle locking device in FIG. 5. The activation bracket 63 has two slides 635 in the face of the swinging bracket 61, whereas the swinging bracket 61 includes two tracks 615 having orientation along direction L1L2, or a first direction, and corresponding to the position of the two slides 635. The two slides 635 extend through the two tracks 615 respectively. With the limit of the slides 635 and the tracks 615, the activation bracket 63 moves with respect to the swinging bracket 61 and the case 5 along direction L1L2. The activation bracket 63 further includes a slant-faced protrusion 634 facing the swinging bracket 61 and the swinging bracket 61 includes an opening 614 corresponding to the slant-faced protrusion 634. The slant-faced protrusion 634 extends through the opening 614 with its slant face facing toward direction L1.

Figure 8:
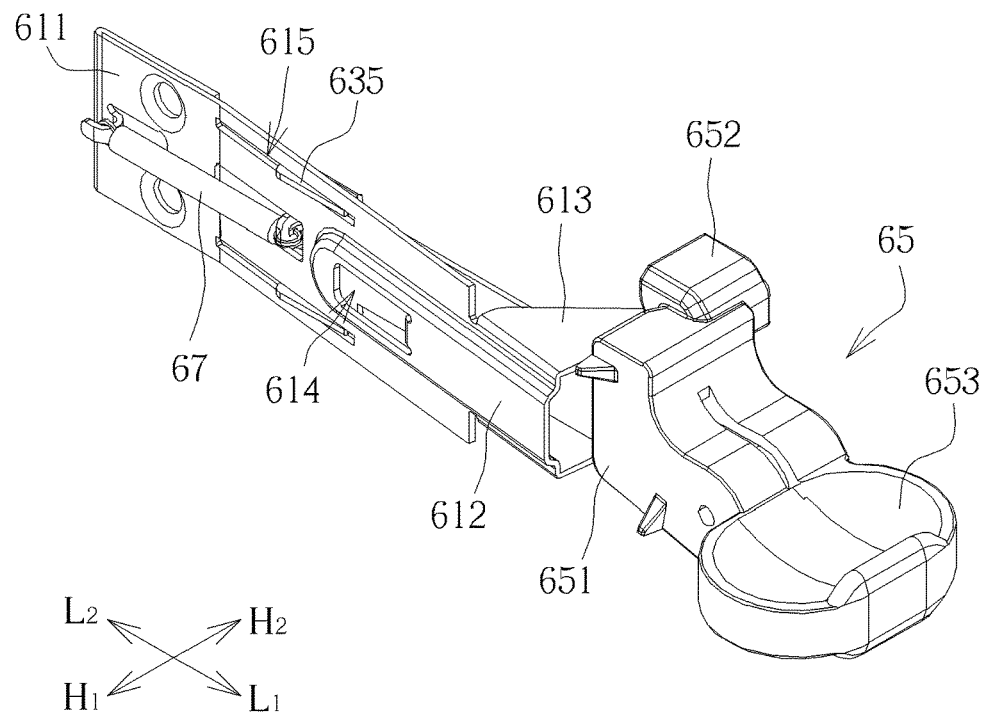
FIG. 8 is a schematic diagram showing the hook of the handle locking device configured to be at an unlocking position.
Figure 9:
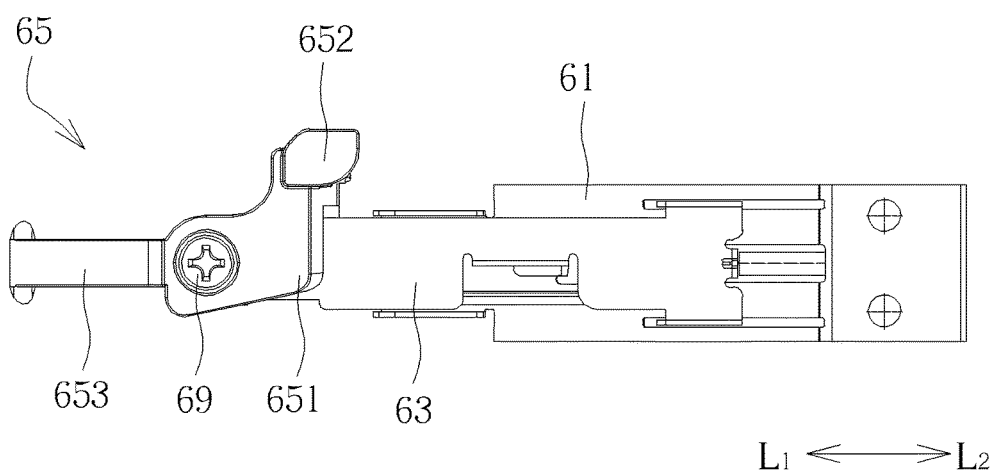
FIG. 9 is a schematic diagram showing a side view of the handle locking device in FIG. 8.
Figure 10:
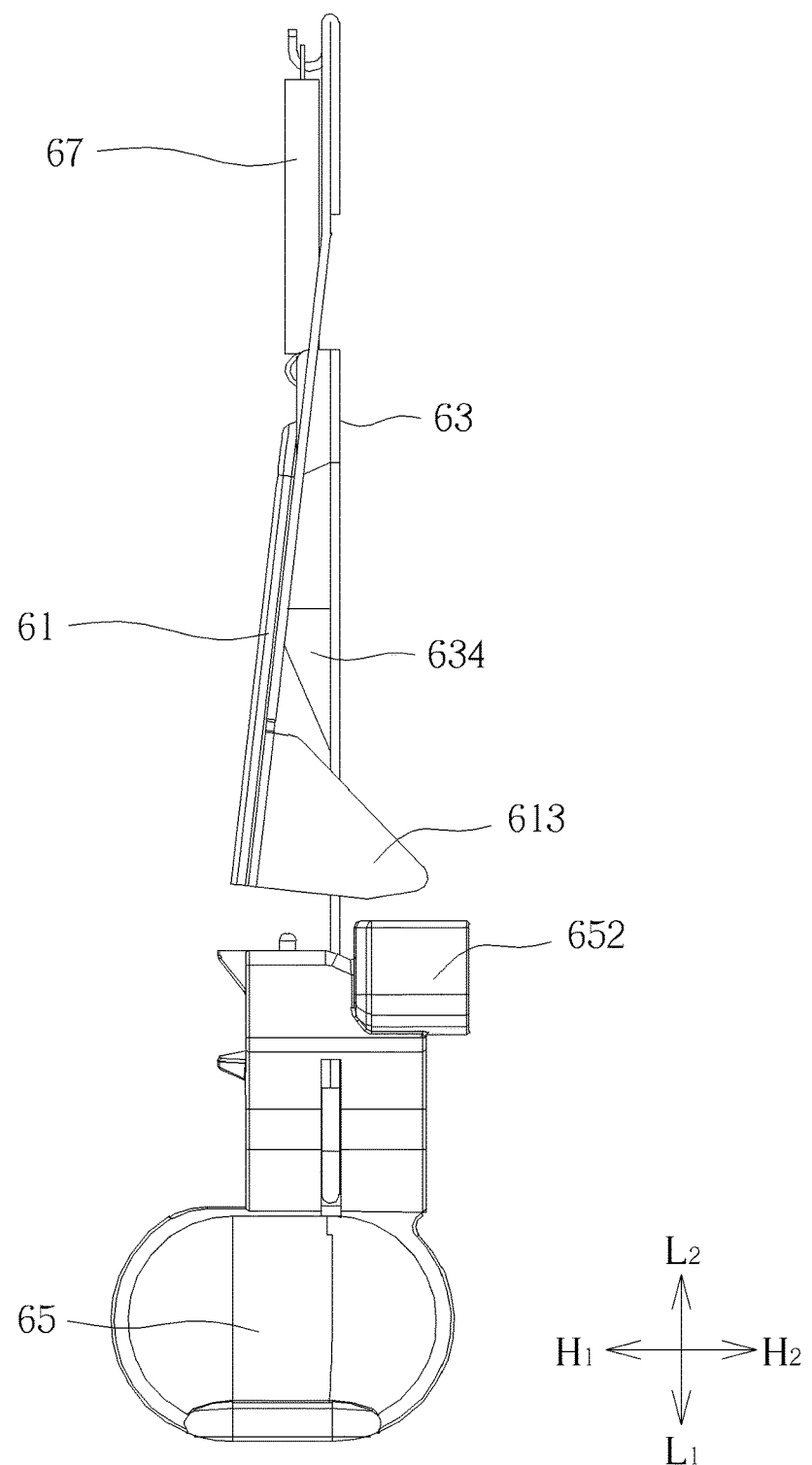
FIG. 10 is a schematic diagram showing a top view of the handle locking device in FIG. 8.

Please refer to FIG. 8 to FIG. 10. FIG. 8 is a schematic diagram showing the hook of the handle locking device configured to be at an unlocking position, FIG. 9 is a schematic diagram showing a side view of the handle locking device in FIG. 8, and FIG. 10 is a schematic diagram showing a top view of the handle locking device in FIG. 8. As the activation bracket 63 moves along direction L1, pulled by the handle 65 to be more specifically, with respect to the swinging bracket 61 and the case 5, the slant face of the slant-faced protrusion 632 in the opening 614 accordingly pushes against the swinging bracket 61, swinging the swinging bracket 61 by taking axis of the first end 611 due to the action of the slant face, i.e., the second end 612 of the swinging bracket 61 is gradually pushed and move toward direction H1, or a second direction, and the hook 613 also moves accordingly from the locking position as shown in FIG. 5 and FIG. 7 to the unlocking position as shown in FIG. 8 and FIG. 10.

The elastic restoring component 67 is a stretching spring in the embodiment, with its two ends respectively connecting to the first end 611 of the swinging bracket 61 and the activation bracket 63. The elastic restoring component 63 is utilized to be stretched to store an elastic restoring force when the activation bracket 63 moves along direction L1 with respect to the swinging bracket 61 and the case 5. As shown in FIG. 8 to FIG. 10, once the exerted pulling force on the activation bracket 63 by the handle 65 vanishes, the stretched elastic restoring component 67 is able to pull the activation bracket 63 toward direction L2, making the slant-faced protrusion 634 no longer pushing the swinging bracket 61; meanwhile, the second end 612 of the swinging bracket 61 swings backward along direction H2 to where it was as shown in FIG. 5 to FIG. 7, with the hook 613 moving from the unlocking position to the locking position, since the slight swinging of the swinging bracket 61 caused by the pushing of the slant-faced protrusion 634 is not a permanent deformation. In other words, as the activation bracket 63 moves along direction L1L2, the activation bracket 63 is able to selectively push the swinging bracket 61 to swing with respect to the case 5 along the first axle (the first end 611 of the swinging bracket 61), whereas the hook 613 is correspondingly configured to be at the locking position or at the unlocking position, and moving between the locking position and the unlocking position, by moving along direction H1H2 with respect to the case 5.

The handle 65 is pivoted to the activation bracket 63 via a second axle 69 and is made rotatable along the second axle 69 with respect to the activation bracket 63. In this embodiment, the second axle 69 is embodied by using a screw as a pivot between the handle 65 and the activation bracket 63. Please refer to FIG. 6 and FIG. 9. The handle 65 includes a first abutting portion 651, a second abutting portion 652, and a handle portion 653, with the first abutting portion 651 and the second abutting portion 652 chamfered respectively. The first abutting portion 651, the second abutting portion 652, and the handle portion 653 are disposed counterclockwise along the second axle 69, where the first abutting portion 651 and the second abutting portion 652 are located at opposite side of the second axle 69 with respect to the handle portion 653. The second abutting portion 652 is located adjacent to the first abutting portion 651. The handle 65 takes the second axle 69 as a rotation center with respect to the activation bracket 63 to be configured to be at a first position as shown in FIG. 6 or at a second position as shown in FIG. 9.

Figure 11:
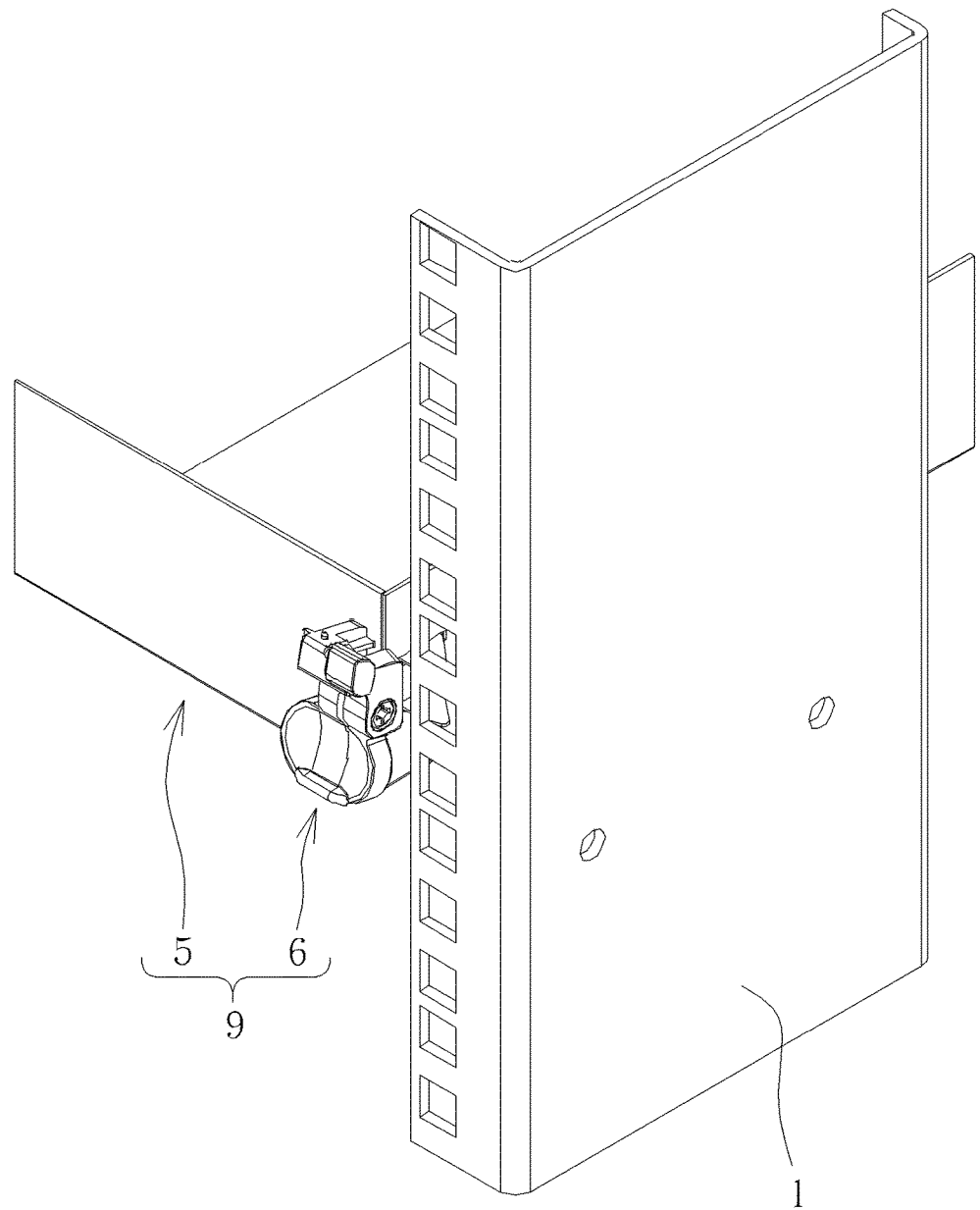
FIG. 11 is a schematic diagram showing partial view of the electronic system of the disclosure fixed to the shelf.
Figure 12:
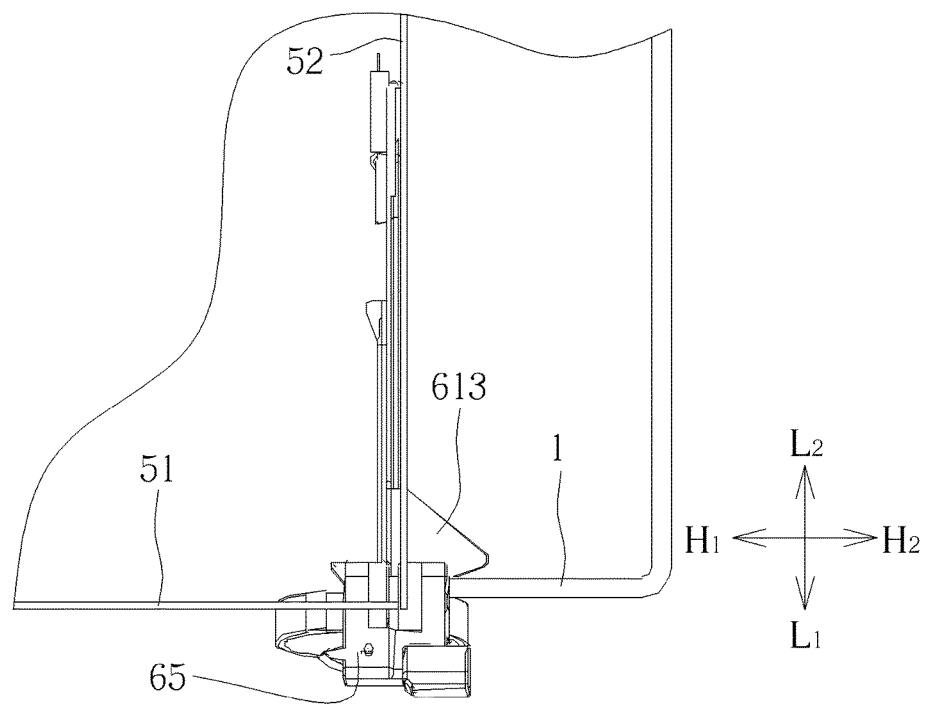
FIG. 12 is a schematic diagram showing a top view of the electronic system in FIG. 11.
Figure 13:
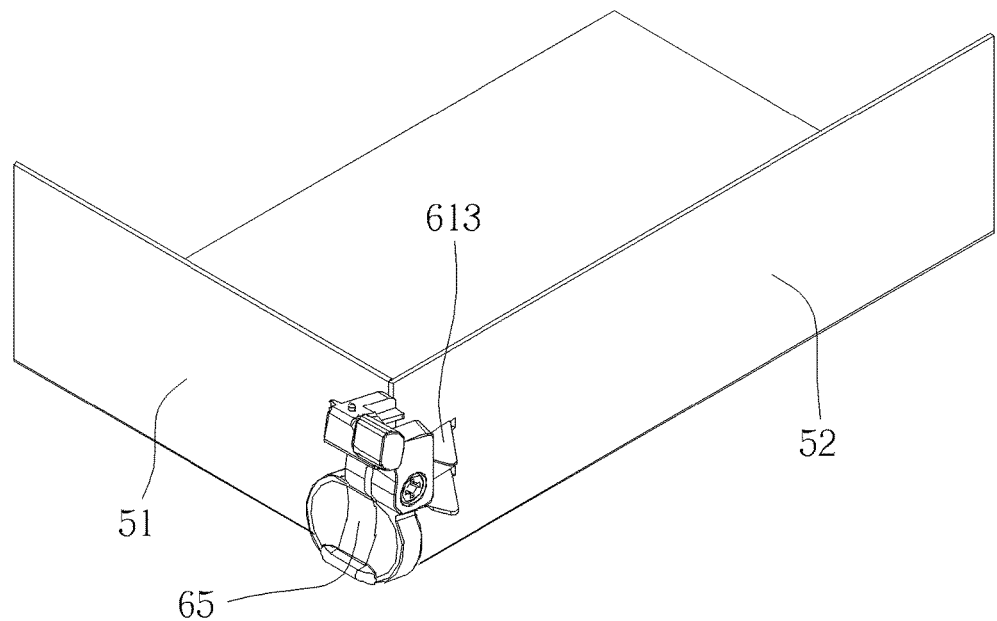
FIG. 13 is a schematic diagram showing a partial view of the electronic system in FIG. 11.

Please refer to FIG. 11 to FIG. 13. FIG. 11 is a schematic diagram showing partial view of the electronic system of the disclosure fixed to the shelf, FIG. 12 is a schematic diagram showing a top view of FIG. 11, and FIG. 13 is a schematic diagram showing a partial view of the electronic system in FIG. 11. For the status shown in FIG. 11 to FIG. 13, the handle 65 of the handle locking device 6 is configured to be at the first position as shown in FIG. 5 and FIG. 6 and the hook 613 of the swinging bracket 61 is configured to be at the locking position as shown in FIG. 7 since the swinging bracket 61 has yet been pushed by the activation bracket 63. It is shown from FIG. 12 that as the electronic system 9 is at the position of fully inserted into the shelf 1, with the handle 65 configured to be at the first position and the hook 613 configured to be at the locking position, the hook 613 abuts against the wall of the shelf 1 for restraining movement of the case 5 and the handle locking device 6 along direction L1 with respect to the shelf 1 and hence effectively locking the electronic system 9 at the shelf 1.

Figure 14:
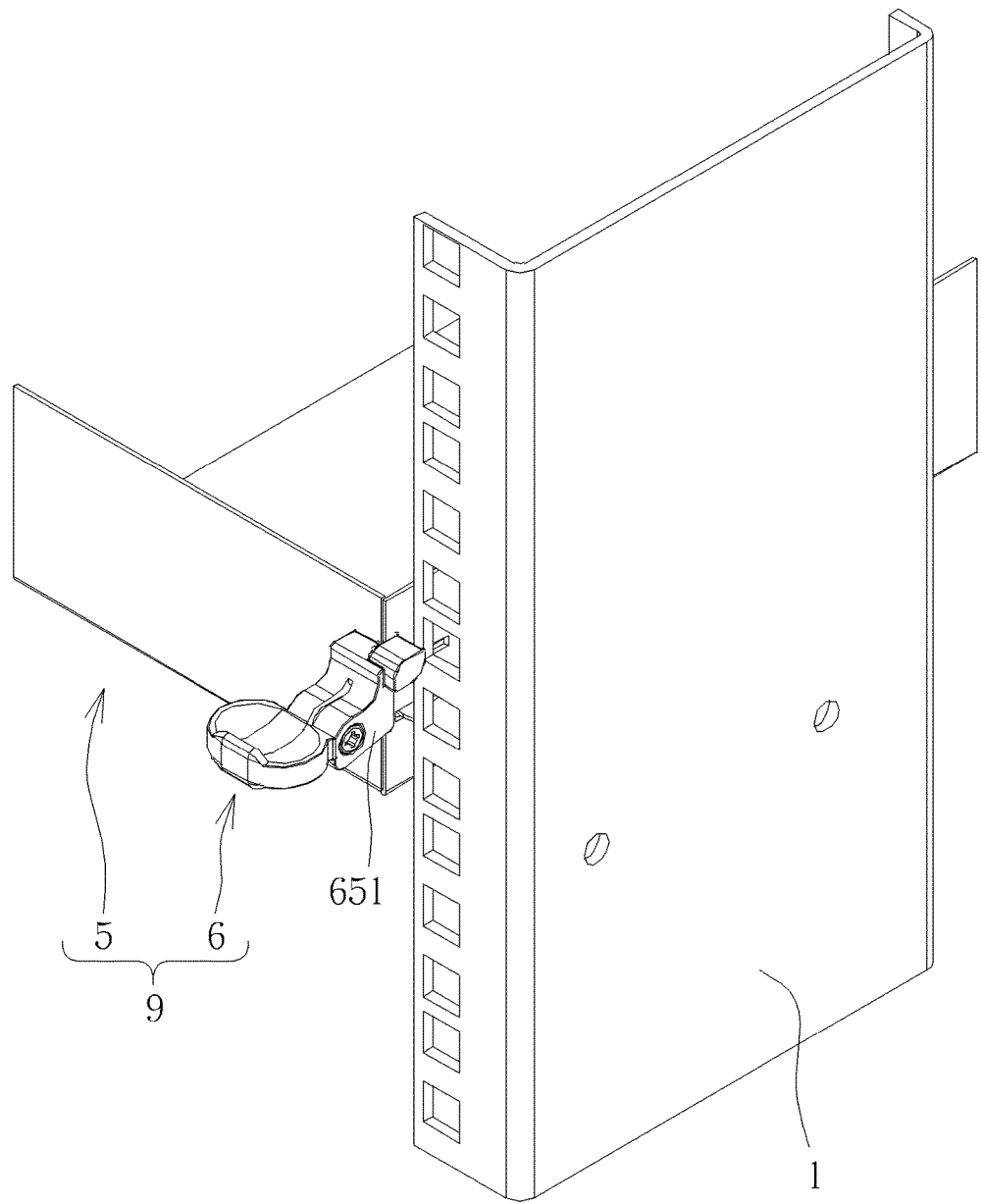
FIG. 14 is a schematic diagram showing partial view of the electronic system of the disclosure unlocked from the shelf.
Figure 15:
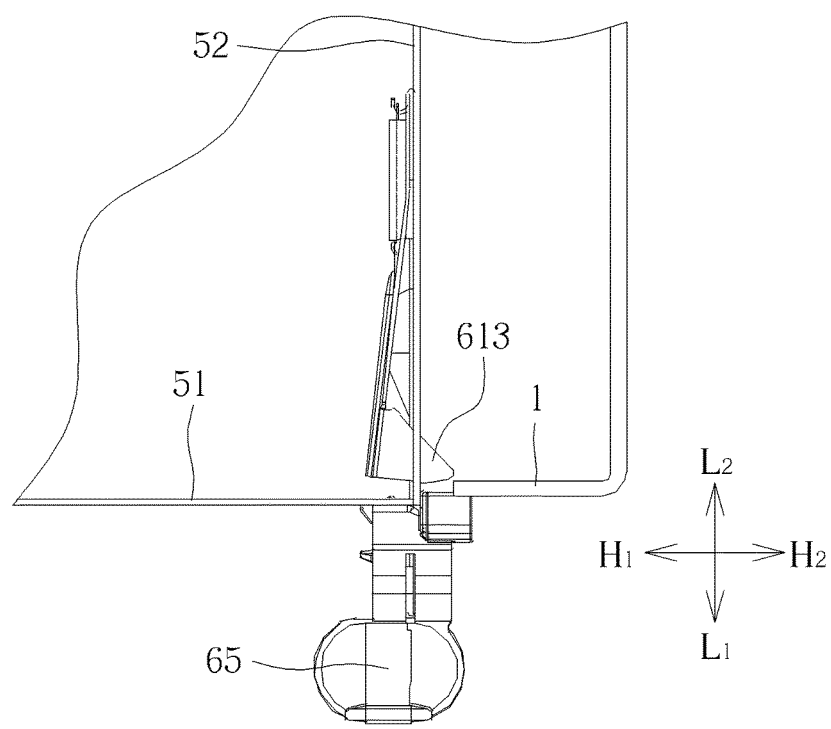
FIG. 15 is a schematic diagram showing a top view of the electronic system in FIG. 14.
Figure 16:
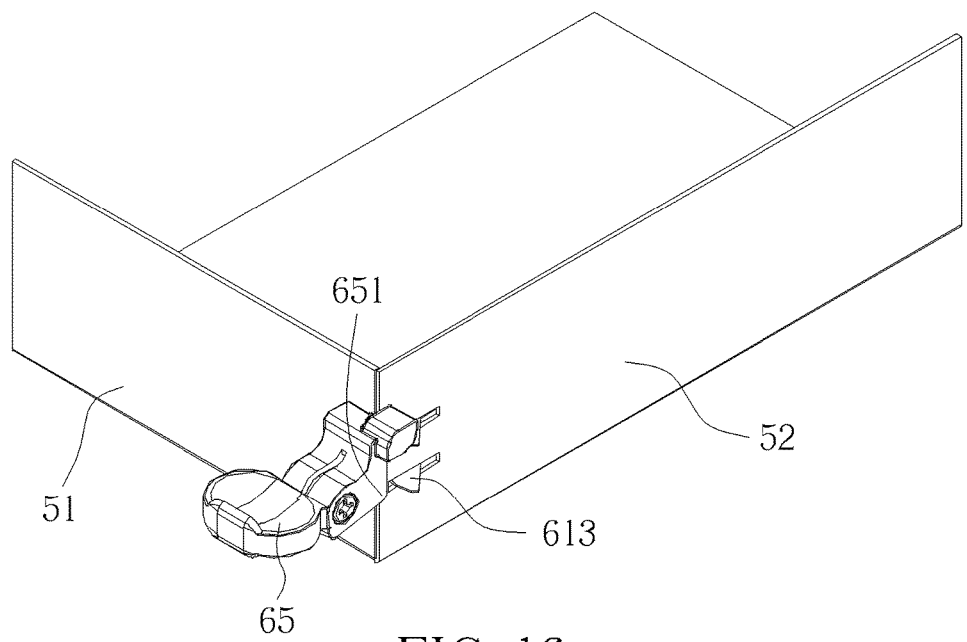
FIG. 16 is a schematic diagram showing a partial view of the electronic system in FIG. 14.

Please refer to FIG. 14 to FIG. 16. FIG. 14 is a schematic diagram showing partial view of the electronic system of the disclosure unlocked from the shelf, FIG. 15 is a schematic diagram showing a top view of FIG. 14, and FIG. 16 is a schematic diagram showing a partial view of the electronic system in FIG. 14. Once the handle 65 is rotated from the first position as shown in FIG. 11 to FIG. 13 to the second position as shown in FIG. 14 to FIG. 16, the first abutting portion 651 of the handle 65 will abut against the case 5 to move the activation bracket 63 along direction L1 with respect to the case 5, and the activation bracket 63, as described earlier, will in turn push the swinging bracket 61 accordingly, swinging the second end 612 and moving the hook 613 toward direction H1 to be configured to be at the unlocking position with respect to the case 5 as shown in FIG. 15. When positioned at the unlocking position, the hook 613 no longer abuts against the wall of the shelf 1. The electronic system 9 is moveable along direction L1 with respect to the shelf 1. Unlocking of the electronic system 9 is accomplished by rotation of the handle 65 on the case 5 converted into displacement of component within the handle locking device 6.

It should be noted that as the handle 65 is to be rotated from the second position in FIG. 14 to the first position in FIG. 11, locking of the electronic system 9 may also be accomplished in the same manner, i.e., rotation of the handle 65 on the case 5 converted into displacement of component within the handle locking device 6.

Figure 17:
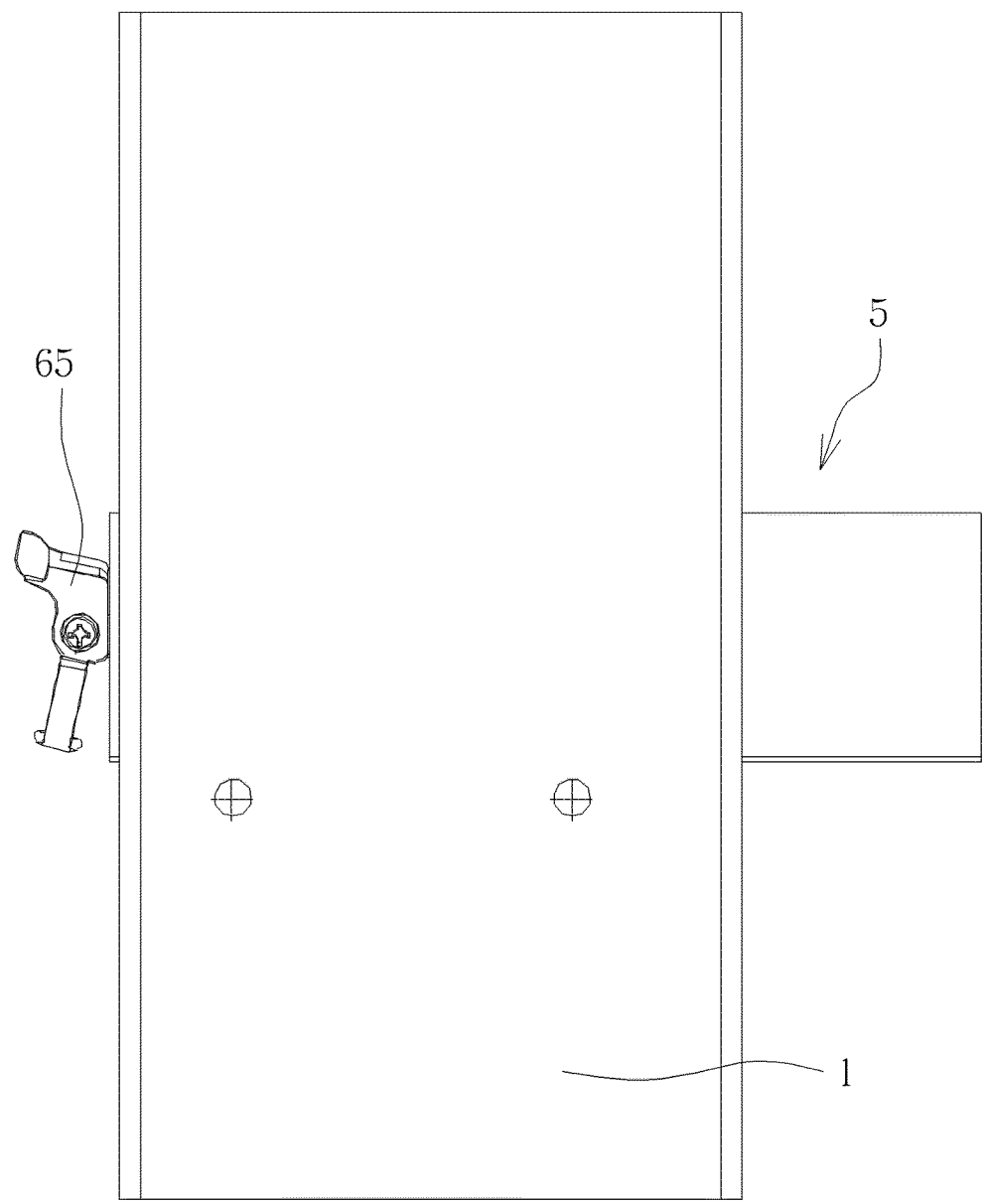
FIG. 17 is a schematic diagram showing a side view of FIG. 11.
Figure 18:
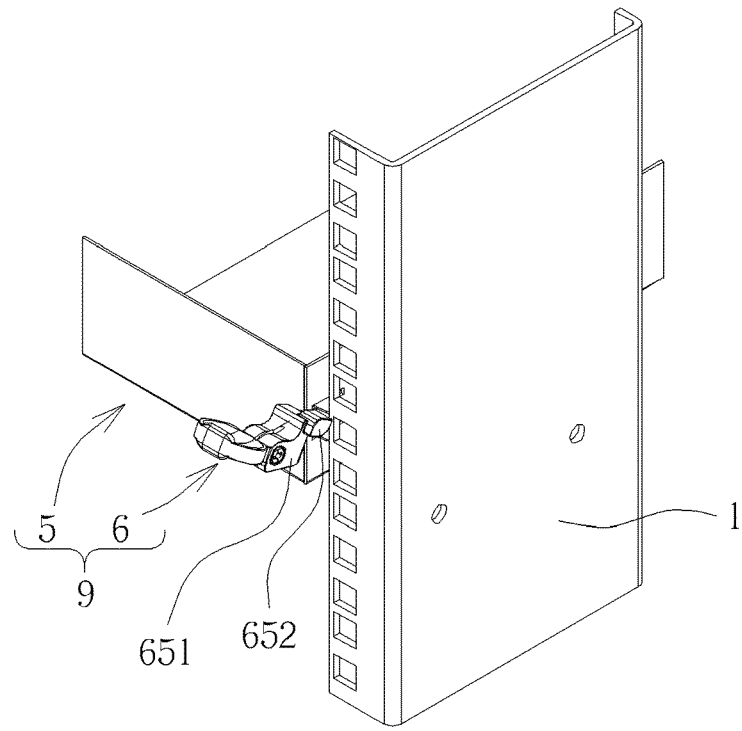
FIG. 18 is a schematic diagram showing a partial view of the electronic system of the disclosure in an unlocking and ejected status on the shelf.
Figure 19:
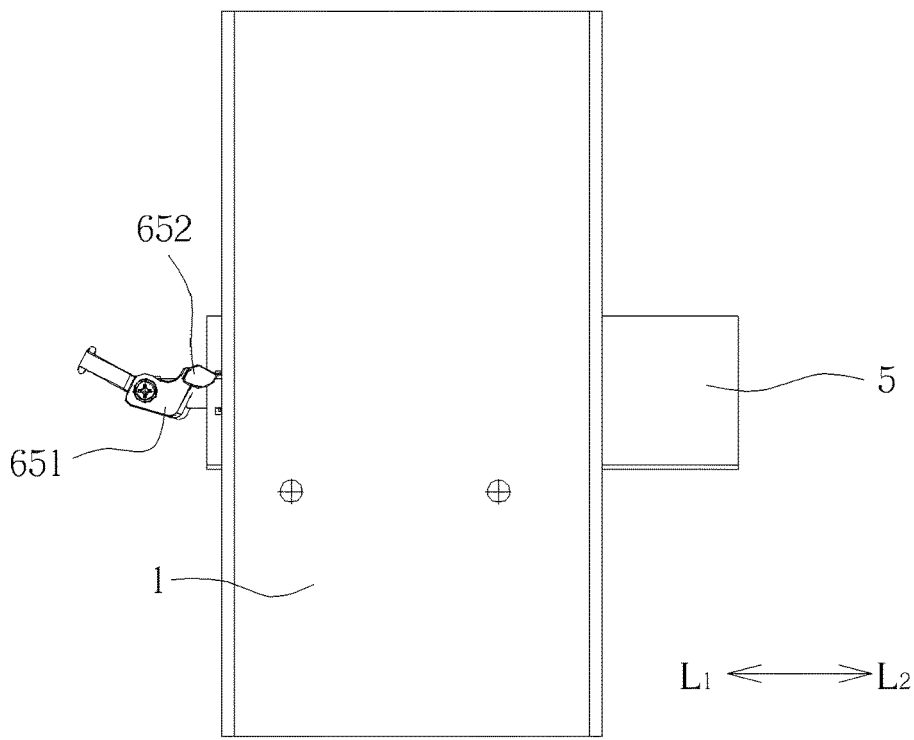
FIG. 19 is a schematic diagram showing a side view of FIG. 18.

Besides the locking and unlocking operations of the electronic system 9, the handle locking device 6 according to the embodiment of the disclosure further offers to perform ejection of the electronic system 9 by use of the second abutting portion 652 of the handle 65. Please refer to FIG. 17 to FIG. 19. FIG. 17 is a schematic diagram showing a side view of FIG. 11, FIG. 18 is a schematic diagram showing a partial view of the electronic system of the disclosure in an unlocking and ejected status on the shelf, and FIG. 19 is a schematic diagram showing a side view of FIG. 18. As the handle 65 rotates along the second axle 69 from the second position as shown in FIG. 14 and FIG. 15 further to a third position as shown in FIG. 18 and FIG. 19, the second abutting portion 652 of the handle 65, which protrudes even outward from the second side wall 52 of the case 5 (referring to FIG. 15), further abuts against the shelf 1 to move the case 5 and the handle locking device 6 along direction L1 with respect to the shelf 1 to eject the electronic system 9 out of the shelf 1. In one embodiment, moving the electronic system 9 from the position as in FIG. 17 to the position as in FIG. 19 means to break away the physical connection between the connectors at the back of the electronic system 9 and the connectors of the shelf 1, and the embodiment of the disclosure utilizes simple rotation of the handle 65 to do so in a relatively labor-saving way.

It should be noted that with the chamfered feature of both the first abutting portion 651 and the second abutting portion 652, the handle 65 provides smoothly abutting experience with the first abutting portion 651 against the case 5 during the rotation from the first position to the second position, and also smoothly abutting experience with the second abutting portion 652 against the shelf 1 during the rotation from the second position to the third position.

The handle locking device and the electronic system having such handle locking device provided by the embodiments of the disclosure use the rotation of the handle for push movement against the case so as to move the linked activation bracket to have displacement relative to the swinging bracket. Pushed by the activation bracket, the swinging bracket produces a lateral swing at one end accordingly so that the hook at the end of the swinging bracket laterally moves between the locking position and the unlocking position. Further rotation of the handle will push against the shelf where the electronic system is mounted and bring the electronic system to move relative to the shelf and eject. A single rotational stroke of the handle can be transformed into consecutive unlocking movement and ejection movement. Insertion, locking, unlocking, and ejection of the electronic system on the shelf are easily done by manual operation of the handle without the need of additional tools.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic system with handle locking device, the electronic system mounted to a shelf in a removable way and comprising:
  a case, having a first side wall and a second side wall adjoining to each other; and
  a handle locking device, disposed at a location where the first side wall and the second side wall adjoin, the handle locking device comprising:
    a swinging bracket, a first end of the swinging bracket fixed to the case and a second end of the swinging bracket comprising a hook;
    an activation bracket, disposed at the case and movable along a first direction with respect to the case to push the swinging bracket to swing with respect to the case along the first end as a first axle, the hook selectively configurable to be at a locking position or at an unlocking position moving along a second direction different from the first direction with respect to the case when the swinging bracket swings with respect to the case; and
    a handle, pivoted to the activation bracket via a second axle and rotatable along the second axle with respect to the activation bracket from a first position to a second position;
  wherein when the handle is positioned at the first position, the hook is configured to be at the locking position with respect to the case; when the handle rotates from the first position to the second position, the handle pushes the case to move the activation bracket along the first direction with respect to the case, the activation bracket pushing the swinging bracket accordingly, in which the hook is configured to be at the unlocking position with respect to the case.

2. The electronic system of claim 1, wherein the handle locking device further comprises an elastic restoring component connected to the first end of the swinging bracket and the activation bracket, the elastic restoring component stretched to store an elastic restoring force when the activation bracket moves along the first direction with respect to the case.

3. The electronic system of claim 2, wherein the elastic restoring component is a stretching spring.

4. The electronic system of claim 1, wherein the first side wall of the case comprises a first slot, the second side wall of the case comprises a second slot, the activation bracket is moveable with respect to the case within the case, passing through the first slot and extending outward the case, and the hook passes through the second slot and configurable to be at the locking position or at the unlocking position with respect to the case.

5. The electronic system of claim 1, wherein the activation bracket is located between the swinging bracket and the second side wall of the case.

6. The electronic system of claim 1, wherein the swinging bracket comprises an opening and the activation bracket comprises a slant-faced protrusion correspondingly extending through the opening; a slant face of the slant-faced protrusion in the opening pushes against the swinging bracket and the hook moves accordingly from the locking position to the unlocking position along the second direction as the activation bracket moves along the first direction with respect to the case.

7. The electronic system of claim 1, wherein the activation bracket comprises two slides and the swinging bracket comprises two tracks having orientation along the first direction and corresponding to the position of the two slides; the two slides extend through the two tracks respectively such that the activation bracket moves with respect to the swinging bracket along the first direction.

8. The electronic system of claim 1, wherein the handle comprises a first abutting portion, a second abutting portion, and a handle portion, the first abutting portion and the handle portion located at opposite sides of the second axle; the first abutting portion abuts against the case to move the activation bracket along the first direction with respect to the case when the handle is configured to be at the second position.

9. The electronic system of claim 8, wherein the second abutting portion is located adjacent to the first abutting portion and the handle is rotatable along the second axle with respect to the activation bracket further from the second position to a third position; the second abutting portion abuts against the shelf to move the case and the handle locking device along the first direction with respect to the shelf when the handle is configured to be at the third position.

10. The electronic system of claim 9, wherein the first abutting portion and the second abutting portion are chamfered.

11. The electronic system of claim 1, wherein when the hook is configured to be at the locking position, the hook abuts against the shelf for restraining movement of the case along the first direction with respect to the shelf.

12. A handle locking device, used for an electronic system, the handle locking device comprising:
    a swinging bracket having a first end and a second end, and the second end of the swinging bracket comprising a hook;
    an activation bracket, movable along a first direction to push the swinging bracket to swing along the first end as a first axle, the hook selectively configurable to be at a locking position or at an unlocking position moving along a second direction different from the first direction when the swinging bracket swings; and
    a handle, pivoted to the activation bracket via a second axle and rotatable along the second axle with respect to the activation bracket from a first position to a second position;
    wherein when the handle is positioned at the first position, the hook is configured to be at the locking position; when the handle rotates from the first position to the second position, the handle moves the activation bracket along the first direction, the activation bracket pushing the swinging bracket accordingly, in which the hook is configured to be at the unlocking position.

13. The handle locking device of claim 12, further comprising an elastic restoring component connected to the first end of the swinging bracket and the activation bracket, the elastic restoring component stretched to store an elastic restoring force when the activation bracket moves along the first direction.

14. The handle locking device of claim 13, wherein the elastic restoring component is a stretching spring.

15. The handle locking device of claim 12, wherein the swinging bracket comprises an opening and the activation bracket comprises a slant-faced protrusion correspondingly extending through the opening; a slant face of the slant-faced protrusion in the opening pushes against the swinging bracket and the hook moves accordingly from the locking position to the unlocking position along the second direction as the activation bracket moves along the first direction.

16. The handle locking device of claim 12, wherein the activation bracket comprises two slides and the swinging bracket comprises two tracks having orientation along the first direction and corresponding to the position of the two slides; the two slides extend through the two tracks respectively such that the activation bracket moves with respect to the swinging bracket along the first direction.

17. The handle locking device of claim 12, wherein the handle comprises a first abutting portion, a second abutting portion, and a handle portion, the first abutting portion and the handle portion located at opposite sides of the second axle; the first abutting portion is forced to move the activation bracket along the first direction when the handle is configured to be at the second position.

18. The handle locking device of claim 17, wherein the second abutting portion is located adjacent to the first abutting portion and the handle is rotatable along the second axle with respect to the activation bracket further from the second position to a third position; wherein the first abutting portion and the second abutting portion are chamfered.

* * * * *